United States Patent
Zhang et al.

(10) Patent No.: US 7,863,974 B2
(45) Date of Patent: Jan. 4, 2011

(54) SELECTABLE INTERMEDIATE FREQUENCY DEMODULATOR

(75) Inventors: Pengfei Zhang, Shanghai (CN); Dawei Guo, Shanghai (CN)

(73) Assignee: Beken Corporation, Shanghai (CN)

( * ) Notice: Subject to any disclaimer, the term of this patent is extended or adjusted under 35 U.S.C. 154(b) by 156 days.

(21) Appl. No.: 12/350,867

(22) Filed: Jan. 8, 2009

(65) Prior Publication Data

US 2010/0141336 A1    Jun. 10, 2010

(30) Foreign Application Priority Data

Dec. 9, 2008    (CN) .................... 2008 1 0044075

(51) Int. Cl.
    *H03D 3/00*    (2006.01)
(52) U.S. Cl. ..................................... 329/325; 455/188.1
(58) Field of Classification Search ................. 329/325; 455/188.1
    See application file for complete search history.

(56) References Cited

U.S. PATENT DOCUMENTS

| | | | | |
|---|---|---|---|---|
| 5,023,939 A | * | 6/1991 | Hori ......................... | 455/188.1 |
| 5,036,291 A | * | 7/1991 | Marz .......................... | 329/325 |
| 5,691,666 A | * | 11/1997 | Owen .......................... | 329/319 |
| 2006/0229052 A1 | * | 10/2006 | De Ruijter .................. | 455/313 |
| 2008/0248765 A1 | * | 10/2008 | Gater ......................... | 455/101 |
| 2008/0290966 A1 | * | 11/2008 | Darabi et al. ............... | 333/167 |

* cited by examiner

*Primary Examiner*—Joseph Chang
(74) *Attorney, Agent, or Firm*—Perkins Coie LLP

(57) ABSTRACT

A method and apparatus for demodulating an input signal in a selectable intermediate frequency system is disclosed. The apparatus includes a front end module, a filter, and a phase lock loop (PLL). The front end module mixes the input signal with an oscillating signal. The filter includes at least one characteristic that is selectable to configure an intermediate frequency. The PLL demodulates an output frequency based on the output of the filter.

12 Claims, 6 Drawing Sheets

SELECTABLE INTERMEDIATE FREQUENCY DEMODULATOR

CROSS-REFERENCE TO RELATED APPLICATION

This application claims priority to Chinese Patent Application No. 200810044075.4, filed Dec. 9, 2008, the disclosure of which is hereby incorporated by reference in its entirety.

TECHNICAL FIELD

The present disclosure is related to methods and apparatus for demodulating an input signal, for example, in a selectable intermediate frequency communications system.

BACKGROUND

Demodulators, for example, in radios, telephones, modems, other communications devices, and/or the like often convert (e.g., down convert or up convert) an input signal to an intermediate frequency. Typically, the conversion of intermediate frequencies is performed to enable the demodulation of input signals at various frequencies with relatively simpler receiver designs and to improve the frequency selectivity of a given demodulator. With down conversion, lower speed signal processing may be employed for the demodulator.

Filters may also be employed to filter a converted signal, for example, to increase a demodulator's sensitivity. However, filters may also limit the input signals that may be demodulated by a given demodulator. For example, a relatively high-bandwidth filter may enable demodulation of input signals over a wide frequency range with relatively low sensitivity, while a relatively low-bandwidth filter may enable demodulation of input signals over a narrow frequency range with relatively high sensitivity.

DETAILED DESCRIPTION

The following description provides specific details for a thorough understanding of, and enabling description for, various embodiments of the technology. One skilled in the art will understand that the technology may be practiced without many of these details. In some instances, well-known structures and functions have not been shown or described in detail to avoid unnecessarily obscuring the description of the embodiments of the technology. It is intended that the terminology used in the description presented below be interpreted in its broadest reasonable manner, even though it is being used in conjunction with a detailed description of certain embodiments of the technology. The term "based on" is not exclusive and is equivalent to the term "based, at least in part, on" and includes being based on additional factors, whether or not the additional factors are described herein. Although certain terms may be emphasized below, any terminology intended to be interpreted in any restricted manner will be overtly and specifically defined as such in this Detailed Description section.

A method and apparatus for demodulating an input signal in a selectable intermediate frequency system is disclosed. The apparatus includes a front end module, a filter, and a phase lock loop (PLL). The front end module mixes the input signal with an oscillating signal. The filter includes at least one characteristic that is selectable to configure an intermediate frequency. The PLL demodulates an output frequency based on the output of the filter.

The apparatus may be employed as a single-conversion low intermediate frequency demodulator, having an intermediate frequency selectable based on a frequency or other characteristic of an input signal to be demodulated. Filter characteristics may be selected to enable relatively high sensitivity demodulation for various input signals. For example, a filter bandwidth, a filter center frequency, a filter frequency response, a filter type, and/or the like may be selected to configure the filter for a given input signal. In addition, the apparatus may be employed in any other circuit or system in which a selectable and/or programmable intermediate frequency may be employed.

Figure 1:
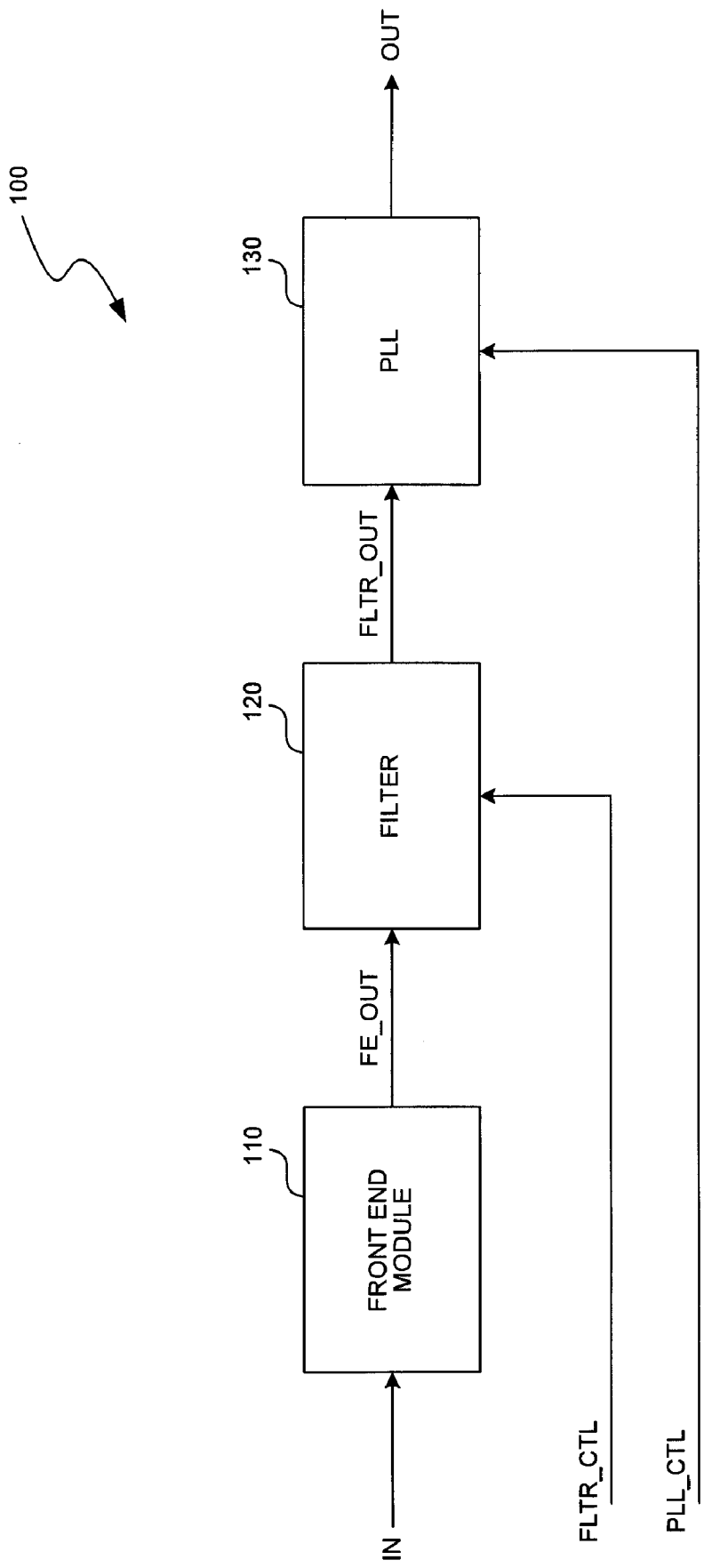
FIG. 1 is a block diagram of a system in accordance with an embodiment of the invention.

FIG. 1 is a block diagram of system 100. As illustrated, system 100 includes front end module 110, filter 120, and PLL 130. In one embodiment, system 100 is configured to demodulate output signal OUT from input signal IN and to operate as a selectable intermediate frequency demodulator. An application specific integrated circuit (ASIC), discrete components, a mixed signal integrated circuit, and/or the like, may be employed in system 100. System 100 may also include analog circuitry, digital circuitry, and/or mixed analog/digital circuitry. In addition, system 100 and/or elements thereof may be implemented as digital signal processor (DSP) code to be executed on a DSP.

System 100 may be employed in the receiver or transceiver of communications devices such as cellular phones, wireless phones, wireless network cards, wireless radios, and/or the like. System 100 may also be employed in or by a wide variety of devices and/or systems in which demodulators may be employed. For example, wireless communications devices, wired communications devices, interface systems, computing devices, optical media devices, embedded systems, and/or other electronic devices or circuits may employ system 100. In one embodiment, system 100 is employed in a receiver of a wireless telephone to demodulate input signal IN.

In one embodiment, input signal IN is provided to front end module 110 from an analog to digital converter (ADC), a digital to analog converter (DAC), a radio frequency (RF) receiver, an RF transmitter, and/or the like (not shown). These and other circuits may be configured to provide input signal IN from a signal that is received over a wired or wireless communications channel. However, input signal IN may be provided from any other suitable source.

Front end module 110 may be configured to receive input signal IN and to provide mixed signal FE_OUT. Front end module 110 may provide mixed signal FE_OUT by mixing input signal IN with an oscillating signal. In one embodiment, the oscillating signal is a local oscillator signal.

Filter 120 may be configured to receive mixed signal FE_OUT, to receive filter control signal FLTR_CTL, and to provide filtered signal FLTR_OUT. In one embodiment, filter 120 is further configured with at least one selectable characteristic. As discussed above, the selectable characteristic may include a filter bandwidth, a filter center frequency, a filter frequency response, a filter type, and/or the like and combinations thereof. Also, the selectable characteristics may be controlled via filter control signal FLTR_CTL. In one example, the selectable characteristic may be controlled to configure an intermediate frequency of system 100.

PLL 130 may be configured to receive filtered signal FLTR_OUT, to receive PLL control signal PLL_CTL, and to provide output signal OUT. PLL 130 may be further configured to demodulate filtered signal FLTR_OUT and to provide data encoded on filtered signal FLTR_OUT (e.g., a data component) on or as output signal OUT. PLL 130 may be configured as a frequency modulation (FM) demodulator, phase shift keying (PSK) demodulator, frequency shift keying (FSK) demodulator, quadrature amplitude modulation demodulator, and/or the like.

PLL 130 may also be configured to control the demodulation of filtered signal FLTR_OUT based on PLL control signal PLL_CTL, as discussed below. Also, output signal OUT may be provided as a recovered bit stream from a physical layer interface and may be provided for downstream processing to a vocoder, a decryption device, an error correction device, and/or the like. In one embodiment, PLL 130 is configured as a selectable frequency FM/FSK demodulator. In another embodiment, PLL 130 is configured as a selectable frequency FM demodulator.

Figure 2:
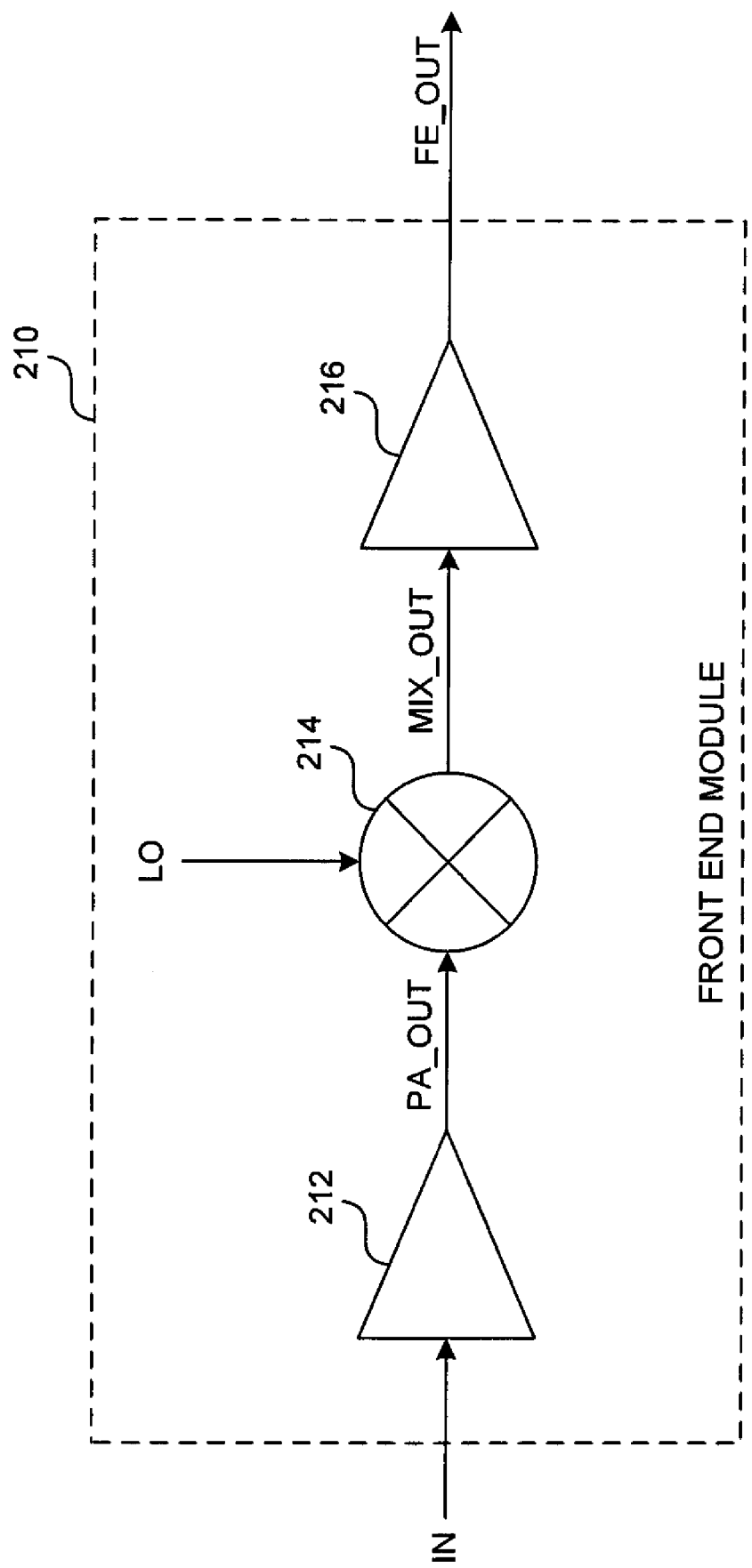
FIG. 2 is a block diagram of a front end module of FIG. 1 in accordance with an embodiment of the invention.

FIG. 2 is a schematic diagram of front end module 210. As illustrated, front end module 210 includes preamplifier 212, mixer 214, and intermediate frequency amplifier 216. Front end module 210 may be employed as an embodiment of front end module 110 of FIG. 1 to provided mixed signal FE_OUT from input signal IN.

As shown, preamplifier 212 is configured to receive input signal IN and to provide preamplified signal PA_OUT. In one embodiment, preamplifier 212 is a low noise amplifier (LNA) configured to receive an RF input signal from an antenna. However, preamplifier 212 may also include an RF amplifier, an operational amplifier, an attenuator, a variable gain amplifier, and/or the like.

Preamplifier 212 may be configured to provide gain or attenuation of any suitable unity or non-unity value. For example, the gain of preamplifier 212 may be set by an automatic gain control (AGC) circuit, a squelch circuit, and/or the like. In addition, the gain of preamplifier 212 may be set based on a frequency of input signal IN, on a saturation level for mixer 214, intermediate frequency amplifier 216, or filter 120 of FIG. 1, and/or the like.

Likewise, mixer 214 is configured to receive preamplified signal PA_OUT, to receive local oscillator signal LO, and to provide mixer output signal MIX_OUT based on mixing preamplified signal PA_OUT with local oscillator signal LO. However, other mixers may also be suitably configured to mix preamplified signal PA_OUT with other oscillating signals, whether or not such oscillating signals are local oscillator signals. Also, mixer 214 may provide mixer output signal MIX_OUT based on multiplying, adding, subtracting, or dividing preamplified signal PA_OUT with local oscillator signal LO. In one example, mixer 214 is configured to multiply preamplified signal PA_OUT with local oscillator signal LO to provide mixer output signal MIX_OUT. Mixer 214 may include a diode circuit, an operational amplifier circuit, an instrumentation amplifier circuit, a difference amplifier circuit, and/or the like.

Intermediate frequency amplifier 216 may be configured to receive mixer output signal MIX_OUT and to provide mixed signal FE_OUT by amplifying mixer output signal MIX_OUT. Intermediate frequency amplifier 216 may provide either unity gain or gain at any suitable non-unity value and may include an operational amplifier circuit, an RF amplifier circuit, a power amplifier circuit, a preamplifier circuit, an attenuation circuit, and/or the like. Intermediate frequency amplifier 216 may also be configured as a variable gain amplifier, a fixed gain amplifier, or it may be omitted and mixer output signal MIX_OUT might be directly provided as mixed signal FE_OUT, and/or the like.

Although FIG. 2 illustrates one embodiment of a suitable front end circuit, other front end circuits may be suitably employed to practice the invention. For example, other suitable front end circuits may include bias circuitry, amplifiers and/or mixers configured to receive differential inputs, to provide differential outputs, configured with separate in-phase and quadrature signal paths, and/or the like. Some examples of other suitable front end circuits are further described in U.S. Patent Application entitled "Method and Apparatus For Biasing a Mixer" by D. Guo et al., the entirety of which is hereby incorporated by reference.

Figure 3:
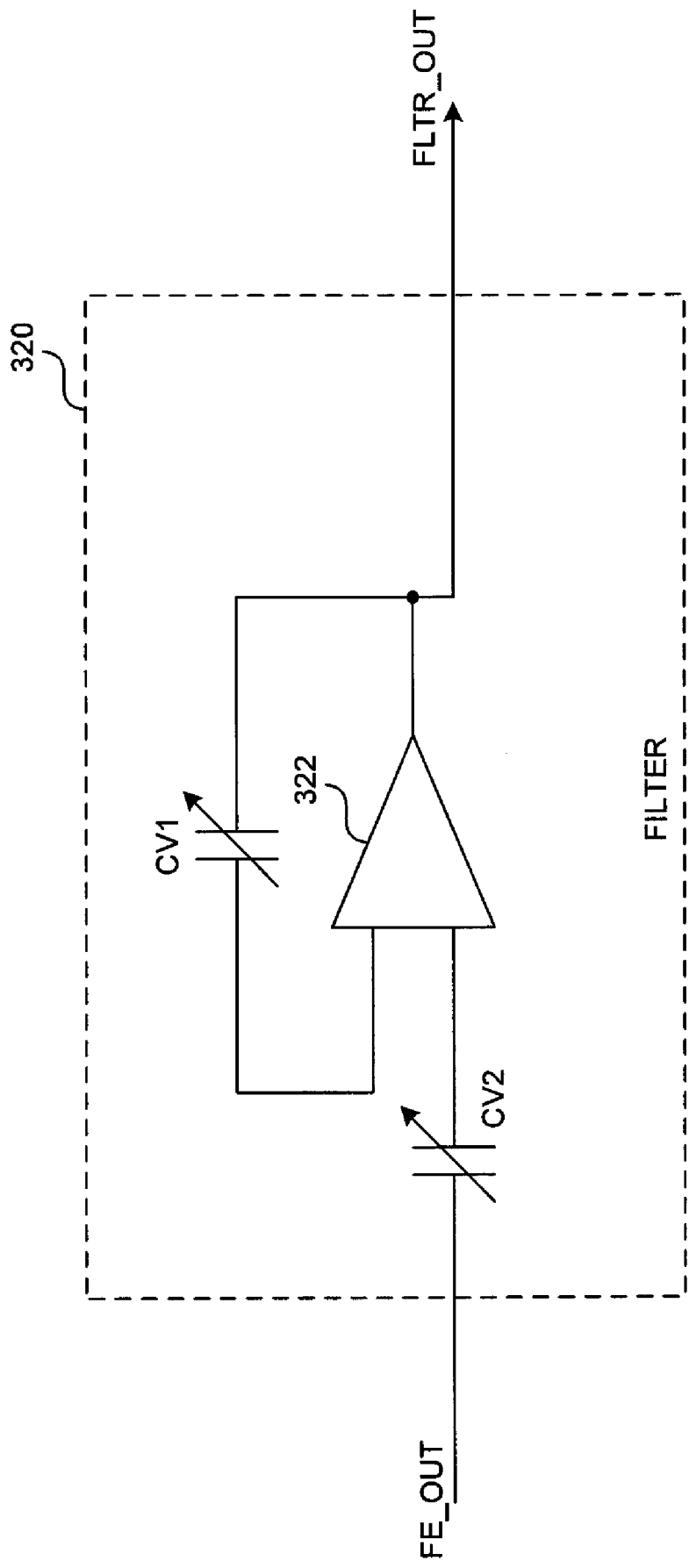
FIG. 3 is a schematic diagram of a filter of FIG. 1 in accordance with an embodiment of the invention.

FIG. 3 is a schematic diagram of filter 320. As illustrated, filter 320 includes amplifier 322, variable capacitance CV1, and variable capacitance CV2. Filter 320 may be employed as an embodiment of filter 120 of FIG. 1 to provide filtered signal FLTR_OUT based on mixed signal FE_OUT.

Amplifier 322, variable capacitance CV1, and variable capacitance CV2 may be configured to operate as a band-pass filter having a center frequency and bandwidth defined by the values of variable capacitance CV1 and variable capacitance CV2. In addition, capacitance values for variable capacitance CV1 and variable capacitance CV2 may be controlled in any suitable way. For example, variable capacitance CV1 and variable capacitance CV2 may be digitally controlled capacitances having values that may be adjusted by a microprocessor and/or microcontroller. In addition, amplifier 322 may be a transconductance amplifier. However, other amplifiers may be employed.

However, filter 320 is only one embodiment of a suitable filter 120. Other configurable filters such as an active or passive surface acoustic wave (SAW) filter, bulk acoustic wave (BAW) filter, crystal filter, RC filter, RLC filter, LC filter, and/or the like may be suitably employed. Typically, band-pass filters are most suitable for filtering mixed signal FE_OUT. However, in certain applications, a high-pass filter, low-pass filter, band-reject filter, and/or the like, may be employed instead of a band-pass filter. In addition, filters with separate in-phase/quadrature signal paths may also be suitably employed. For example, such a filter may receive separate in-phase/quadrature mixed signals, separately filter the in-phase and quadrature mixed signals, and combine the output of the in-phase and quadrature filters at a summing junction (not shown).

In other embodiments, filter 120 may be implemented as DSP code to be executed on a DSP. For example, such a filter may include a configurable finite impulse response filter, infinite impulse response filter, Chebyshev filter, elliptic filter, Bessel filter, Linkwitz-Riley filter, Butterworth filter, and/or the like.

In one embodiment, filter 120 is a software reconfigurable complex fourth order Butterworth filter having a selectable center frequency and bandwidth. In this example, the filter may be software reconfigurable from a center frequency of 1.2 MHz with an 800 KHz bandwidth to a center frequency of 300 KHz with 150 KHz bandwidth. This filter may be further configured to, in part, provide image rejection and channel selection for a communications device.

Figure 4A:
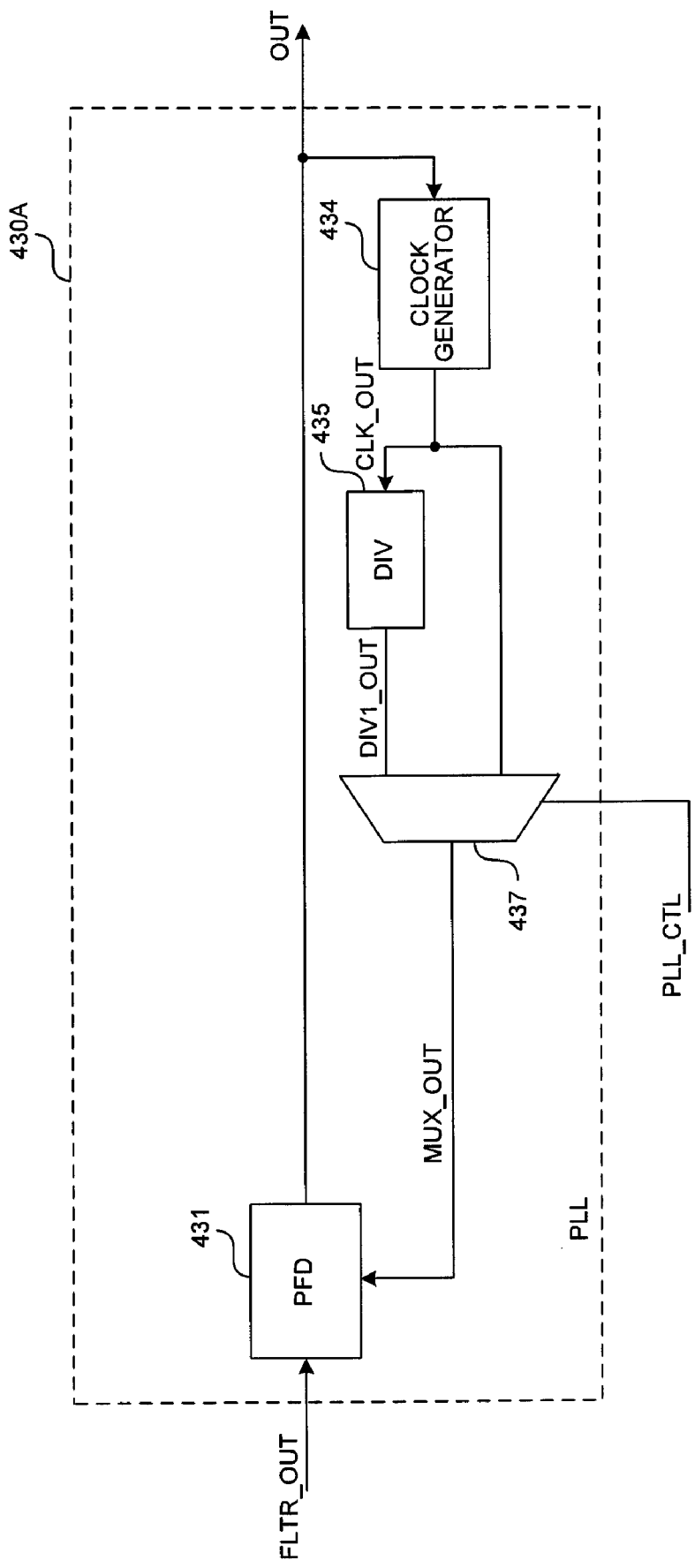
FIG. 4A is a block diagram of a PLL of FIG. 1 in accordance with an embodiment of the invention.

FIG. 4A is a block diagram of PLL 430A. As illustrated, PLL 430A includes phase frequency detector (PFD) 431, clock generator 434, divider 435, and multiplexer 437. PLL 430A may be employed as an embodiment of PLL 130 of FIG. 1 and may be configured to demodulate output signal OUT from filtered signal FLTR_OUT.

As shown, PFD 431 is configured to receive filtered signal FLTR_OUT as a PLL input signal, to receive clock feedback signal MUX_OUT, and to provide output signal OUT. PFD 431 may be configured to provide output signal OUT as both as a demodulated output signal and as a phase error signal to represent a difference between filtered signal FLTR_OUT and clock feedback signal MUX_OUT. In addition, PFD 431 may also operate as part of a closed feedback loop to drive a frequency and/or phase of output signal OUT to match that of filtered signal FLTR_OUT.

In one embodiment, PFD 431 is configured to provide a value on output signal OUT that is proportional to the phase difference between filtered signal FLTR_OUT and clock feedback signal MUX_OUT. In another embodiment, PFD 431 may provide a value on output signal OUT that is proportional to a frequency difference between filtered signal FLTR_OUT and clock feedback signal MUX_OUT.

Clock generator 434 is configured to receive output signal OUT as a clock generator control signal and to provide generated clock signal CLK_OUT. Also, clock generator 434 may be configured to set the frequency of generated clock signal CLK_OUT based on output signal OUT. Clock generator 434 may include a digital clock synthesizer, a voltage controlled oscillator, a current controlled oscillator, a crystal oscillator, a ring oscillator, a surface acoustic wave oscillator, a Colpitts oscillator, and/or the like. In one embodiment, PLL 430A may also include a charge pump and/or low-pass filter that are configured to provide the input to clock generator 434 based on the output of PFD 431 (not shown).

As shown, generated clock signal CLK_OUT is fed back to PFD 431 either via multiplexer 437 or via divider 435 and multiplexer 437. For example, a frequency of clock generator 434 and PLL 430A may be controlled by selecting a feedback frequency for PFD 431 based on PLL control signal PLL_CTL.

In one embodiment, divider 435 is a frequency divider such as a counter, timer, Miller frequency divider, frequency synthesizer, and/or the like. Divider 435 may also be configured to divide the frequency of generated clock signal CLK_OUT by any suitable divisor. However, in other embodiments, divider 435 may be replaced with a multiplier instead of a divider.

Multiplexer 437 may include any suitable multiplexer configured to provide clock feedback signal MUX_OUT by selecting either generated clock signal CLK_OUT or divided clock signal DIV1_OUT based on PLL control signal PLL_CTL. Although multiplexer 437 is illustrated as a two-input multiplexer to enable selection between two feedback frequencies, multiplexers with any number of inputs may also be employed to select between any other number of feedback frequencies.

Figure 4B:
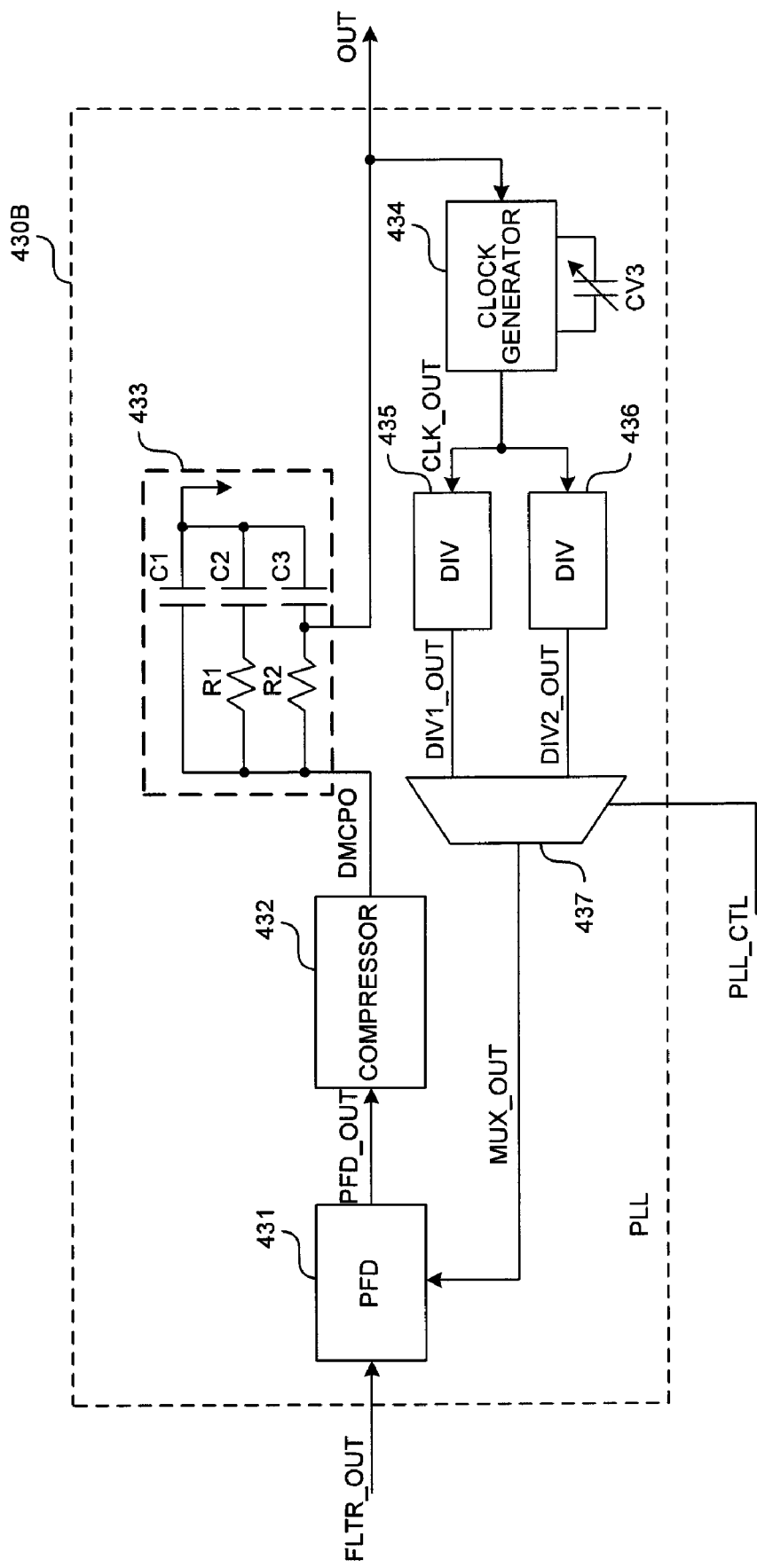
FIG. 4B is a block diagram of another PLL of FIG. 1 in accordance with another embodiment of the invention.

FIG. 4B is a block diagram of PLL 430B. As illustrated, PLL 430B includes PFD 431, compressor 432, output circuit 433, clock generator 434, divider 435, divider 436, multiplexer 437, and variable capacitance CV3. PLL 430B may be employed as an embodiment of PLL 130 of FIG. 1. PFD 431, clock generator 434, divider 435, and multiplexer 437 of FIG. 4B may be as described above with reference to FIG. 4A.

Compressor 432 may be configured to receive phase error signal PFD_OUT from PFD 431 and to provide compressed signal DMCPO to output circuit 433. As illustrated, compressor 432 is further configured to scale phase error signal PFD_OUT by a scaling factor prior to providing compressed signal DMCPO. Compressor 432 may employ a multiplication operation, a division operation, employ a shift register, and/or the like, to scale phase error signal PFD_OUT. Examples of other compressors and the operation thereof are further described in U.S. patent application entitled "Method and Apparatus For Digital Clock Recovery" by S. Li et al., the entirety of which is hereby incorporated by reference.

Output circuit 433 is configured to receive compressed signal DMCPO and to provide output signal OUT by filtering compressed signal DMCPO. As shown, output circuit 433 includes capacitors C1-C3 and resistors R1-R2. Any suitable types and values of capacitors and resistors may be employed as capacitors C1-C3 and resistors R1-R2.

Similar to divider 435, divider 436 may be a frequency divider or multiplier such as those described above with reference to FIG. 4A.

Variable capacitance CV3 is included in some embodiments to, for example, tune or otherwise adjust the operation of clock generator 434. As with variable capacitances CV1-CV2 of FIG. 4A, variable capacitance CV3 may be controlled in any suitable way. For example, variable capacitance CV3 may be a digitally controlled capacitance having a value that may be adjusted by a microprocessor and/or microcontroller.

In one embodiment, clock generator 434 is configured to generate generated clock signal CLK_OUT at a frequency of approximately 7.2 MHz, divider 435 is configured as a divide-by-six counter to provide divided clock signal DIV1_OUT at a frequency of approximately 1.2 MHz, and divider 436 is configured as a divide-by-24 counter to provide divided clock signal DIV2_OUT at a frequency of approximately 300 KHz. In this embodiment, the output bandwidth of PLL 430B may be approximately 50 KHz. In addition, other examples of other suitable PLL and/or demodulator circuits are further described in U.S. patent application entitled "Method and Apparatus For Automatic Frequency Correction" by W. Wang et al., the entirety of which is hereby incorporated by reference.

Figure 5:
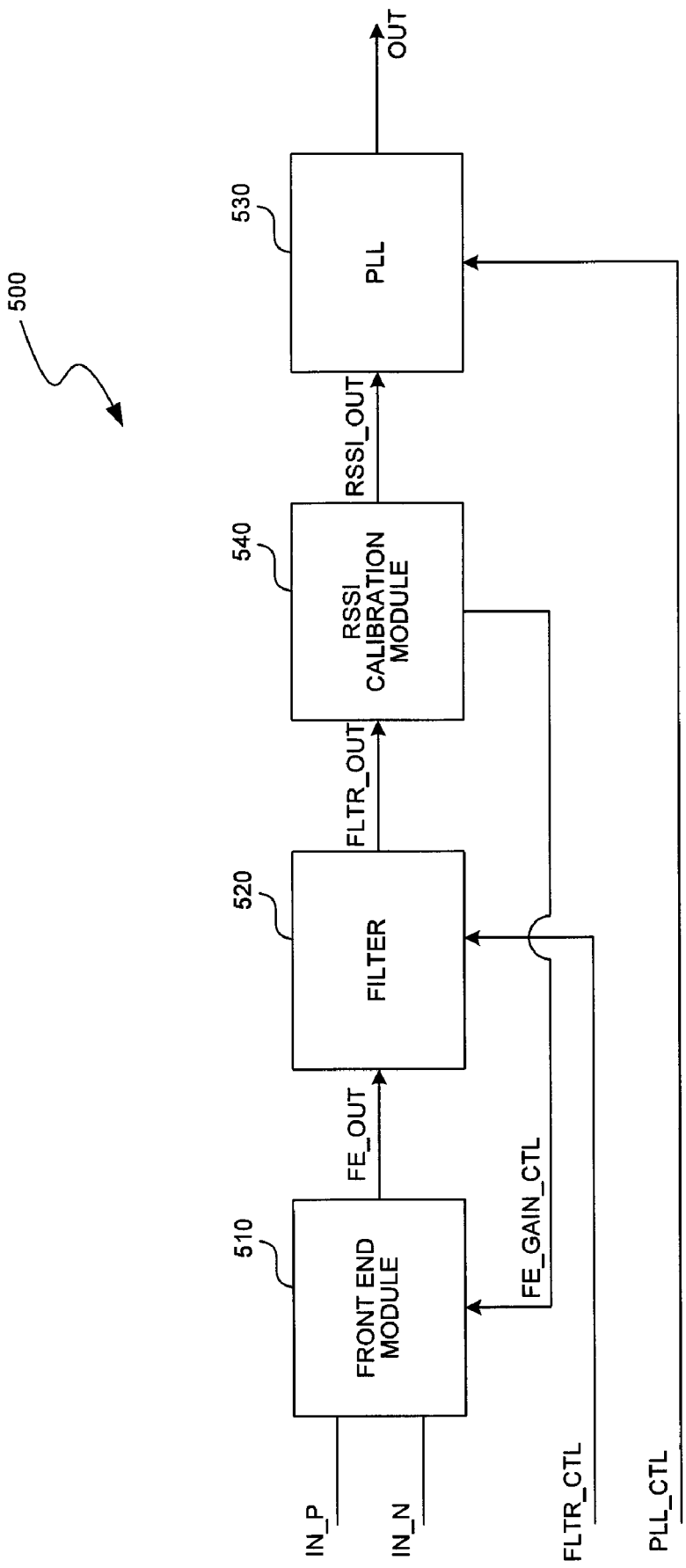
FIG. 5 is a block diagram of another system in accordance with another embodiment of the invention.

FIG. 5 is a block diagram of system 500. As illustrated, system 500 includes front end module 510, filter 520, PLL 530, and Received Signal Strength Indicator (RSSI) calibration module 540. In one embodiment, system 500 is configured to demodulate output signal OUT from input signal IN and to operate as a selectable intermediate frequency demodulator. System 500 may be employed as an embodiment of system 100 of FIG. 1.

As shown in FIG. 5, front end module 510 is configured to receive a differential input signal pair IN_P/IN_N, to receive gain control signal FE_GAIN_CTL, and to provide mixed signal FE_OUT by mixing input signal pair IN_P/IN_N with a differential or single-ended oscillating signal. In addition, front end module 510 may be further configured to configure a gain of a LNA or other preamplifier based on gain control signal FE_GAIN_CTL (not shown). However, gain control signal FE_GAIN_CTL may also be employed to configure a gain of an intermediate frequency amplifier or any other suitable amplifier.

Filter 520 and PLL 530 may be included as respective embodiments of filter 120 and PLL 130 of FIG. 1.

RSSI calibration module 540 may be included to provide gain control signal FE_GAIN_CTL based on a detected RSSI on filtered signal FLTR_OUT and to provide signal RSSI_OUT to PLL 530 based on filtered signal FLTR_OUT. For example, RSSI calibration module 540 may provide gain control signal FE_GAIN_CTL as an automatic gain control signal to normalize the power on filtered signal FLTR_OUT.

In addition, gain control signal FE_GAIN_CTL may be compared against a threshold and/or reference signal to configure a gain of front end module 510 (not shown). For example, an error amplifier, an operational amplifier circuit, a differential amplifier circuit, and/or the like, may be suitably employed for such a purpose. In one embodiment, RSSI calibration module 540 is configured to provide signal RSSI_OUT to be substantially equal to filtered signal FLTR_OUT.

Further details regarding RSSI calibration module 540 are discussed in U.S. Patent Application entitled "Methods and Apparatus For Calibrating Received Signal Strength Indicators" by D. Guo et al., the entirety of which is hereby incorporated by reference While the above Detailed Description describes certain embodiments of the invention, and describes the best mode contemplated, no matter how detailed the above appears in text, the invention can be practiced in many ways. Details of the system may vary in implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description explicitly defines such terms. Accordingly, the actual scope of the invention encompasses not only the disclosed embodiments, but also all equivalent ways of practicing or implementing the invention under the claims.

We claim:

1. An apparatus for demodulating a signal, comprising:
a front end module configured to receive an input signal and to provide a mixed signal by mixing the input signal with an oscillating signal;
a filter configured to receive the mixed signal and to provide a filtered signal by filtering the mixed signal, wherein at least one characteristic of the filter is selectable based on a filter control signal; and
a phase lock loop (PLL) configured to receive the filtered signal and to demodulate an output signal from the filtered signal, wherein the PLL includes
a phase frequency detector configured to provide a phase error signal based on a difference between a PLL input signal and a clock feedback signal, wherein the PLL input signal is based on the filtered signal;
a clock generator configured to generate a generated clock signal based on the phase error signal;
a divider configured to provide a divided clock signal by dividing a frequency of the generated clock signal;
a multiplexer configured to provide the clock feedback signal by selecting one of the divided clock signal or another clock signal based on a PLL control signal, wherein the another clock signal is either the generated clock signal or is based on the generated clock signal;
another divider configured to provide another divided clock signal by dividing the frequency of the generated clock signal, wherein the multiplexer is configured to provide the clock feedback signal by selecting one of the divided clock signal or the another divided clock signal based on the PLL control signal;
a compressor configured to provide a scaled signal based on scaling the PLL input signal by a scaling factor; and
an output circuit coupled between a first node and a second node and configured to receive the scaled signal at the first node and to provide the output signal from a third node, wherein the output circuit includes:
a first capacitor coupled between the first node and the second node;
a first resistor coupled between the first node and a fourth node;
a second capacitor coupled between the fourth node and the second node;
a second resistor coupled between the first node and the third node; and
a third capacitor coupled between the third node and the second node.

2. The apparatus of claim 1, wherein the at least one characteristic of the filter is selectable to configure an intermediate frequency of the apparatus.

3. The apparatus of claim 1, wherein the at least one selectable characteristic of the filter includes at least one of a filter bandwidth, a filter center frequency, a filter frequency response, or a filter type.

4. The apparatus of claim 1, wherein the at least one selectable characteristic of the filter includes a filter bandwidth and a filter center frequency.

5. The apparatus of claim 1, wherein the filter includes a fourth order Butterworth filter.

6. The apparatus of claim 1, wherein the filter includes at least one of a configurable finite impulse response filter, infinite impulse response filter, Chebyshev filter, elliptic filter, Bessel filter, Linkwitz-Riley filter, or Butterworth filter.

7. The apparatus of claim 1, wherein the filter is implemented as digital signal processor (DSP) code to be executed on a DSP.

8. The apparatus of claim 1, wherein a clock frequency of the PLL is selectable based on a PLL control signal.

9. The apparatus of claim 1, wherein the front end module includes:
a preamplifier configured to receive the input signal and to provide a preamplified signal by preamplifying the input signal;
a mixer configured to receive the preamplified signal, to receive the oscillating signal, and to provide a mixer output signal by multiplying the preamplified signal with the oscillating signal, wherein the oscillating signal is a local oscillator signal; and
an intermediate frequency amplifier configured to receive the mixer output signal and to provide the mixed signal by amplifying the mixer output signal.

10. The apparatus of claim 9, wherein the preamplifier includes a low noise amplifier.

11. The apparatus of claim 1, wherein the front end module, the filter, and the PLL are configured to operate as a selectable intermediate frequency demodulator.

12. The apparatus of claim 11, wherein the front end module, the filter, and the PLL are further configured to operate in the receiver or transceiver of a cellular phone, a wireless phone, a wireless network card, or a wireless radio.

* * * * *